United States Patent [19]

Becke

[11] Patent Number: 4,561,008

[45] Date of Patent: Dec. 24, 1985

[54] BALLASTED, GATE CONTROLLED SEMICONDUCTOR DEVICE

[75] Inventor: Hans W. Becke, Morristown, N.J.

[73] Assignee: RCA Corporation, Princeton, N.J.

[21] Appl. No.: 870,484

[22] Filed: Jan. 18, 1978

[30] Foreign Application Priority Data

Feb. 7, 1977 [GB] United Kingdom ............... 04943/77

[51] Int. Cl.[4] ............................................. H01L 29/74
[52] U.S. Cl. ...................................... 357/38; 357/20; 357/36; 357/68; 357/86
[58] Field of Search ....................... 357/38, 20, 36, 86, 357/68

[56] References Cited

U.S. PATENT DOCUMENTS

| 3,430,115 | 2/1969 | Webb | 357/36 |
| 3,504,242 | 3/1970 | Wolley | 357/38 |
| 3,611,072 | 10/1971 | Hamilton | 357/38 |
| 3,619,738 | 11/1971 | Otsuka | 357/38 |
| 3,902,188 | 8/1975 | Jacobson | 357/36 |
| 3,914,781 | 10/1975 | Matsushita et al. | 357/20 |

OTHER PUBLICATIONS

D. Carley et al., "The Overlay Transistor, PT.I: New Geometry Boosts Power", Electronics, Aug. 23, 1965, pp. 70-84.
J. Gillett, "Power Transistor having Incr. Rev. Bias Safe Operating Area", IBM Tech. Discl. Bull., vol. 16, #11, Apr. 1974, p. 3642.

Primary Examiner—Joseph E. Clawson, Jr.
Attorney, Agent, or Firm—Birgit E. Morris; Donald S. Cohen; Robert Ochis

[57] ABSTRACT

A gate controlled semiconductor device comprises a cathode region having a current defocusing region associated therewith. The defocusing region is unmetallized but substantially completely surrounded by cathode metallization. The defocusing region comprises only a relatively small percentage of the total cathode region and conducts current during the on-state of the device. However, during turn-off of the device substantially all of the conducting plasma is forced to flow in the defocusing region.

8 Claims, 3 Drawing Figures

BALLASTED, GATE CONTROLLED SEMICONDUCTOR DEVICE

The present invention generally relates to gate controlled semiconductor devices and, in particular, relates to such devices having ballast means associated therewith.

Gate controlled semiconductor devices, for example, silicon controlled rectifiers, are becoming widely used throughout many industries. As the demand for such devices increases, there is more and more emphasis on gate turn-off devices. One major problem faced by designers of such devices, particularly for such devices handling large amounts of power, is that during the turn-off mode of operation almost all of the on-state conducting current is often constricted into a relatively small high density plasma filament. Such a high density plasma filament has considerably high temperatures associated therewith and can cause thermal runaway in the device, which often results in its damage or destruction.

One solution to this problem has been to provide an integral ballast resistor at the end of the cathode region. This integral ballast resistor is usually positioned such that it is further away from the gate region than the remainder of the cathode region. This location is chosen since the current is forced away from the cathode region where the turn-off pulse is introduced and thus the on-state current is forced along the cathode region toward the ballasting portion. It is thought that the plasma filament is forced into the resistive region where, since there is no cathode metallization thereover, it is extinguished. Such a solution has a number of drawbacks, for example, this type of resistive ballast region utilizes chip area which is substantially inopertive during the on-state of the device. That is, normal conduction current during the on-state of the device does not flow through such a ballast region since there is no cathode metallization to force such conduction. Another problem, is that there is no guarantee that the high density current plasma will form totally within the resistive region. That is, the likelihood of the plasma filament being forced completely into the resistive region away from the metallized cathode region is suspect in nature. Indeed, since there is no cathode metallization over the resistive region, the current may tend to accumulate and constrict at the borderline between the end of the metallization portion of the cathode and the non-metallized ballasting region. Such a situation may cause damage along the metallization border due to the high temperatures which would be present.

A gate controlled semiconductor device designed according to the principles of the present invention substantially solves these problems. That is, the ballast, or defocusing, region conducts current during the on-state and is positioned to insure that the high density plasma filament formed during turn-off is located therein.

Figure 1:
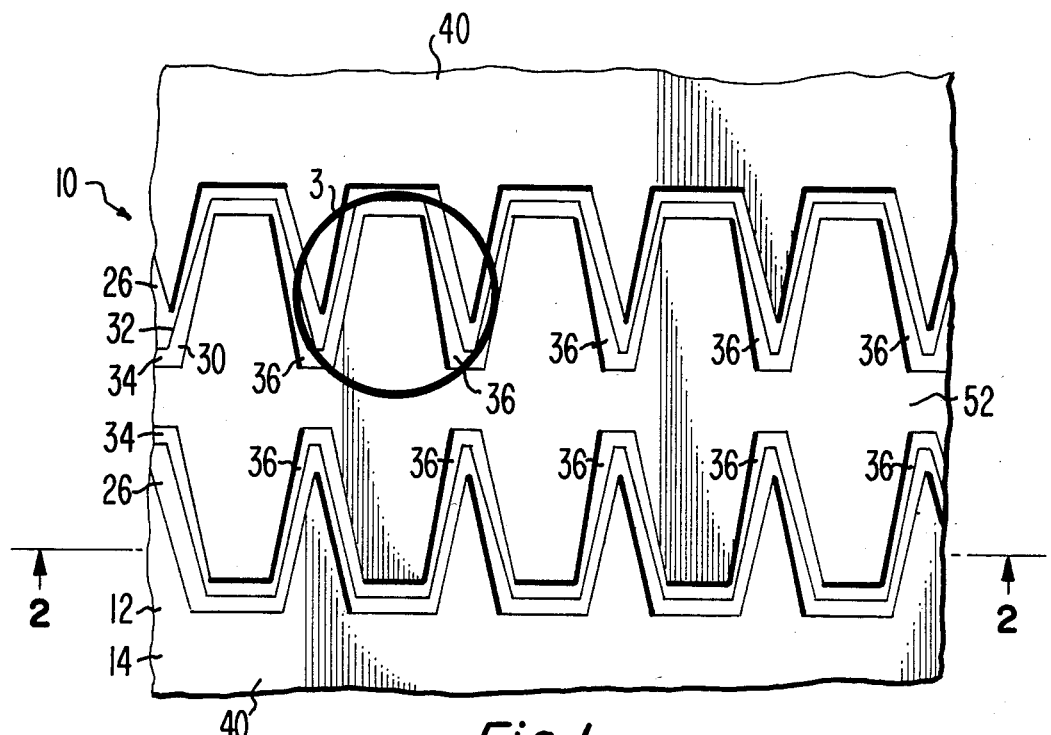
FIG. 1 is a partial plan view of a portion of a semiconductor device, not drawn to scale, embodying the principles of the present invention.
Figure 2:
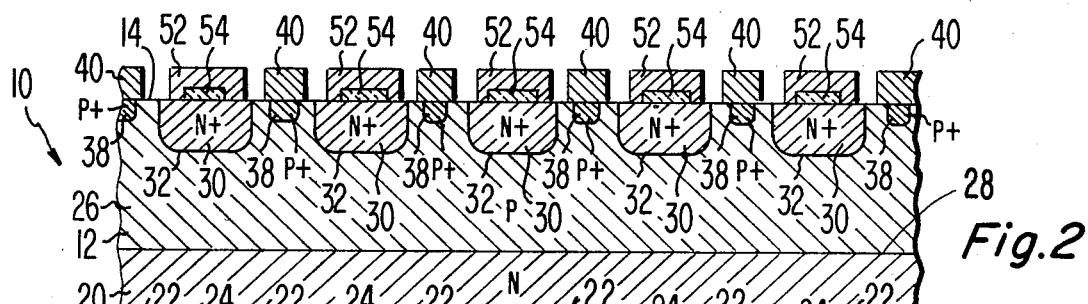
FIG. 2 is a cross-sectionl view of the device shown in FIG. 1 taken along the line 2—2 thereof.

A gate controlled semiconductor device, indicated generally at 10 in the drawing, embodying the principles of the present invention, compises a body 12 of semiconductor material having first and second major opposing surfaces 14 and 16, respectively. Preferably, although not necessarily, the body has a thickness of about 125 micrometers (5 mils) and is substantially in the shape of a square having sides of about 0.4 cm (160 mils) in length.

An anode region 18 having a one type conductivity, for example, P type, is adjacent the second surface 16. Although the anode region 18 has been designated as being of P type material, it may also be N type material so long as all other conductivity types designated hereinafter are likewise changed.

A base region 20 having a second type conductivity, in this example N type, is adjacent the anode region 18 and forms a first PN junction 22 at the interface therewith. The base region 20, as more fully discussed below, preferably extends through the anode region 18 to the second surface 16 at a plurality of locations 24 which are more fully distinguished and defined hereinafter.

A gate region 26, having the one type conductivity, is adjacent the base region 20 and extends to the first surface 14. The gate region 26 forms a second PN junction 28 with the base region 20 at the interface therebetween. Further, the gate region 26 is spaced apart from the anode region 18 by the base region 20.

A cathode region 30 having the second type conductivity is adjacent the first surface 14 and extends into the gate region 26 forming a third PN junction 32 at the interface therewith. The third PN junction 32 intercepts the first surface 14. Although the cathode region 30 can be any shape desired, i.e., circular, square or the like, it is preferred that it be in the shape of a comb having a back 34 and finger portions 36 extending substantially perpendicularly from the back 34. That is, the third PN junction 32 appears interdigitated at the first surface 14. Alternatively, the cathode region 30 can be comprised of a plurality of individual regions which can then be electrically connected together by metallization.

Preferably, a gate trigger region 38 substantially completely surrounds the fingers 36 of the cathode region 30 and extends into the gate region 26. In the instance where the cathode region 30 is, for example, ring shaped, the gate trigger region 38 can either surround the cathode region 30 externally or be located as a single pocket inside the cathode region 30. The gate trigger region 38 is characterized in that it is of the same conductivity type as, and a comparatively higher conductivity concentration than, the gate region 26.

A gate electrode 40 overlies and electrically contacts the gate trigger region 38 and permits external electrical contact thereto. An anode electrode 42 overlies and electrically contacts the anode region 18 and any portion of the base region 20 extending to the second surface 16 therethrough.

Figure 3:
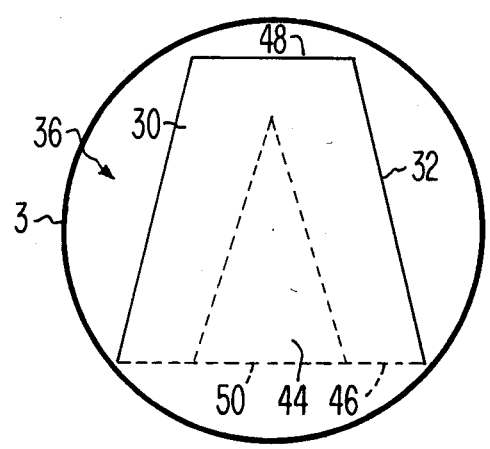
FIG. 3 is an enlarged detailed view of the encircled area of FIG. 1.

The cathode region 30 contains an integral defocusing portion 44, shown by dashed lines in FIG. 3, therein. The defocusing portion 44 is preferably, although not necessarily, located at and around the two dimensional geometrical center of gravity of the cathode region 30. In the example given above, the defocusing portion 44 is located at and around the two dimensional geometrical center of gravity of each cathode finger 36. Alternatively, for other shapes, the defocusing portion 44 is defined as surrounding the two dimensional geometrical center of gravity of those particular shapes. Referring to FIG. 3, wherein a single cathode finger 36 without metallization thereon is shown in detail, a cathode finger 36 having the shape of a trapezoid with a first base 46, shown in dashed lines, on the order of about 110 micrometers (4.5 mils) and the second base 48 being on the order of about 63 micrometers (2.5 mils) has a defocusing portion 44 which is centrally located along the center line of the finger 36. In this instance the defocusing region 44 is shaped like a triangle having a base 50 on the order of about 50 micrometers (2 mils) and a height substantially equal to the height of the trapezoid of the finger 36. The area of each defocusing portion 44 in this example comprises about 28% of the total area of each cathode finger 36. Preferably, regardless of the shape of the defocusing portion 44 and the cathode region 30, the defocusing portion 44 comprises less than about 30% of the area thereof.

A cathode electrode 52 overlies and electrically contacts the cathode region 30 and substantially completely surrounds and defines the defocusing portion 44. The term "substantially completely surrounds" in this instance, is taken to mean that the cathode electrode 52 contacts the cathode region 30 around more than 50% of the periphery of the defocusing portion 44. Preferably, for reasons discussed more fully below, however, the cathode electrode 52 completely surrounds the defocusing portion 44. For ease of fabrication, the cathode electrode 52 can overlie the defocusing portion 44 providing it is electrically isolated therefrom by, for example, a layer 54 of silicon dioxide or a similar insulator.

As mentioned above, it is preferred that the base region 20 extend through the anode region 18. Preferably, these extensions are substantially vertically aligned with each defocusing portion 44.

Throughout the following discussion of the operation of the device 10, the following biasing conditions are assumed: The cathode electrode 52 is considered at ground potential and the anode electrode 42 is considered positive with respect thereto. When a positive pulse is supplied to the gate electrode 40, upon regeneration, the device 10 begins to fully conduct and the gate pulse can be removed. The details of such turn-on mechanisms are well known in the art and need not be further discussed. It should be noted, however, that during the on-state current does indeed flow in the defocusing portion 44 because it is relatively small, i.e., less than about 30% in area with respect to the total cathode region 30, and because it is substantially completely surrounded by the cathode electrode 52. Thus, the defocusing portion 44 is not wasted space during the conducting state of the device 10.

When a negative pulse is applied to the gate electrode 40, the conducting plasma is forced away from the gate trigger region 38. That is, the conducting current begins to be restricted, which, in the case where the gate trigger region 38 surrounds the cathode region 30, means that the conduction current is compressed toward the two-dimensional geometrical center of gravity of the cathode region 30. As the conduction current constricts, the plasma density increases and the lateral electric field, i.e., the electric field which is substantially parallel with the first surface 14, becomes significant. It is believed that as the lateral electric field increases, the integral resistance of the unmetallized defocusing portion 44 forces the current to be reduced within the plasma at the center of the plasma filament. Thus, as the plasma forms the center of the filament has a reduced current density compared to its periphery due to the integral resistance of that unmetallized defocusing portion 44. For this reason, the temperature, and thus the potential for thermal runaway, is severly reduced in the defocusing portion 44 itself. As a result turn-off can be accomplished without substantial damage to the device 10 due to high temperatures.

In addition to the mechanism described above, the overall turn-off operation can be improved by allowing the base region 20 to extend through the anode region 18 to the second surface 16 in areas which are substantially vertically aligned with the defocusing portion 44. This configuration introduces a non-regenerative section which is vertically aligned with the defocusing portion 44. Such a non-regenerative section permits a rapid turn-off because the high density plasma filament flowing in the defocusing portion 44 does not regenerate the flow of holes from the anode region 18 and thus continued regeneration is substantially prevented. Thus, a device 10 containing a defocusing portion 44 and a non-regenerative section according to the principles of the present invention only needs to turn-off the conducting current that is flowing during the initial time of the turn-off pulse. In other words, once the plasma filament is almost totally within the defocusing portion 44, regeneration substantially stops and no further current is added to the filament.

The use of such a defocusing portion 44 as decribed above, not only permits better control of the turn-off operation but also permits the use of such a defocusing portion 44 during the conduction mode of the device 10's operation. The presence of a non-regenerative segment reduces the amount of time required to turn-off the device 10 and results in a device 10 which has a greater capability to withstand relatively high currents. In addition, such a device 10 has a reduced susceptibility to burn out due to thermal runaway.

What is claimed is:

1. A gate controlled semiconductor device comprising:

a body of semiconductor material having first and second major opposing surfaces;

an anode region having one type conductivity adjacent said second surface;

a base region having a second type conductivity adjacent said anode region and forming a first PN junction at the interface therewith;

a gate region having said one type conductivity adjacent said base region and forming a second PN junction at the interface therewith, said gate region extending to said first surface;

a cathode region having said second type conductivity adjacent said first surface and extending into said gate region and forming a third PN junction at the interface therewith, said third PN junction terminating at said first surface;

said cathode region including an integral defocusing portion, a cathode electrode overlying and electrically contacting said cathode region without contacting said defocusing portion;

said defocusing portion being substantially completely surrounded by the portion of said cathode region which is contacted by said cathode electrode; and said base region extending through said anode region to said second surface in substantial vertical alignment with said defocusing portion.

2. A gate controlled semiconductor device comprising:
   a body of semiconductor material having first and second major opposing surfaces;
   an anode region having one type conductivity adjacent said second surface;
   a base region having a second type conductivity adjacent said anode region and forming a first PN junction at the interface therewith;
   a gate region having said one type conductivity adjacent said base region and forming a second PN junction at the interface therewith, said gate region extending to said first surface;
   a cathode region having said second type conductivity adjacent said first surface and extending into said gate region and forming a third PN junction at the interface therewith, said third PN junction terminating at said first surface;
   said cathode region including an integral defocusing portion;
   a cathode electrode overlying and electrically contacting said cathode region without contacting said defocusing portion;
   said defocusing portion being substantially completely surrounded by the portion of said cathode region which is contacted by said cathode electrode;
   said cathode region having the shape of a comb, said comb having a back and a plurality of finger portions extending therefrom; there being one of said defocusing portion associated with each of said fingers;
   each said defocusing portion comprising less than about thirty percent (30%) of the area of each of said fingers; and
   said base region extending through said anode region to said second surface in substantial vertical alignment with each said defocusing portion.

3. A device as claimed in claim 1 wherein:
   said defocusing portion is completely surrounded by said portion of said cathode region which is contacted by said cathode electrode.

4. A device as claimed in claim 1 wherein:
   said defocusing portion is located about the two-dimensional geometrical center of gravity of said cathode region.

5. A device as claimed in claim 1 wherein:
   said cathode region has the shape of a comb, said comb having a back and a plurality of finger portions extending therefrom; there being one said defocusing portion associated with each of said fingers.

6. A device as claimed in claim 5 wherein:
   each said defocusing portion comprises less than about thirty percent (30%) of the area of each of said fingers.

7. A device as claimed in claim 1 wherein:
   said defocusing portion comprises less than about thirty percent (30%) of the area of said cathode region.

8. A device as claimed in claim 1 wherein:
   said cathode electrode overlies but is substantially electrically isolated from said defocusing portion.

* * * * *